United States Patent
Rottstegge

(10) Patent No.: US 7,067,234 B2
(45) Date of Patent: Jun. 27, 2006

(54) CHEMICAL CONSOLIDATION OF PHOTORESISTS IN THE UV RANGE

(75) Inventor: Jörg Rottstegge, Erlangen (DE)

(73) Assignee: Infineon Technologies AG, Munich (DE)

( * ) Notice: Subject to any disclaimer, the term of this patent is extended or adjusted under 35 U.S.C. 154(b) by 265 days.

(21) Appl. No.: 10/186,651

(22) Filed: Jul. 1, 2002

(65) Prior Publication Data

US 2003/0068585 A1   Apr. 10, 2003

(30) Foreign Application Priority Data

Jun. 29, 2001   (DE) ................................ 101 31 488

(51) Int. Cl.
  *G03F 7/20*   (2006.01)
  *G03F 7/38*   (2006.01)
  *G03F 7/40*   (2006.01)
  *G03F 7/004*  (2006.01)

(52) U.S. Cl. ...................... 430/296; 430/311; 430/330; 430/331; 430/270.1

(58) Field of Classification Search ................ 430/296, 430/270.1, 311, 313, 315, 330, 331
See application file for complete search history.

(56) References Cited

U.S. PATENT DOCUMENTS

| | | | | |
|---|---|---|---|---|
| 4,491,628 A | * | 1/1985 | Ito et al. ...................... | 430/176 |
| 5,173,393 A | * | 12/1992 | Sezi et al. ................... | 430/323 |
| 5,234,793 A | * | 8/1993 | Sebald et al. ............... | 430/323 |
| 5,650,261 A | * | 7/1997 | Winkle ..................... | 430/270.1 |
| 6,063,549 A | | 5/2000 | Schadeli et al. | |
| 6,475,699 B1 | * | 11/2002 | Uetani et al. ............ | 430/270.1 |

FOREIGN PATENT DOCUMENTS

EP   0 395 917 B1   11/1990

OTHER PUBLICATIONS

Grant & Hackh, Chemical Dictionary, 1987, McGraw-Hill, Inc., 5th Edition, p. 22.*

* cited by examiner

*Primary Examiner*—Mark F. Huff
*Assistant Examiner*—John Ruggles
(74) *Attorney, Agent, or Firm*—Laurence A. Greenberg; Werner H. Stemer; Ralph E. Locher

(57) ABSTRACT

Structured resists are consolidated, that is post-exposure amplified. The amplifying agent used is a compound which contains at least one bicyclic or polycyclic group. The amplifying agent is attached via a reactive group to a reactive anchor group of a polymer that is used for the resist. The process is particularly suitable for amplifying copolymers of cycloolefins and maleic anhydride.

9 Claims, No Drawings

CHEMICAL CONSOLIDATION OF PHOTORESISTS IN THE UV RANGE

BACKGROUND OF THE INVENTION

Field of the Invention

The invention relates to a process for consolidating (i.e., post-exposure amplifying) structured resists.

In the fabrication of microchips, thin layers of photoresists are used for structuring (or patterning) semiconductor substrates. The photoresists can be selectively altered in chemical terms by exposure using a photomask or by direct irradiation, with a beam of electrons, for example. Following a developing step, wherein either the exposed or the unexposed areas of the photoresist are removed, a structured resist is obtained which is used as a mask, for example, for etching the semiconductor substrate. In the case of dry etching, the etching operation is generally carried out with a fluorine or oxygen plasma. In order to be able to carry out selective etching only of the bare areas of substrate, the mask-forming resist structure must have sufficient resistance to the plasma.

When an oxygen-containing etch plasma is used, therefore, the photoresist generally comprises a polymer carrying silicon-containing groups. In the course of the etching operation these groups are converted to silicon dioxide, which forms an etch-resistat protective layer on the photoresist. The silicon atoms may either already be present in the polymer of the photoresist or may be introduced into the polymer subsequently, following the development of the structured resist, in a post-exposure amplifying reaction. For this purpose, the reactive groups, such as acid anhydride groups, carboxyl groups or acidic phenolic hydroxyl groups, to which the amplifying agent, which carries a corresponding reactive group, an amino group for example, can be attached chemically are provided in the polymer.

Chemically amplified photoresists (CARs) were developed to enable low exposure doses and short exposure times for exposing the photoresist. In that case the photoresist comprises a photosensitive compound which, on exposure, releases a catalyst. In a subsequent amplifying step, the catalyst is able to bring about a chemical reaction which causes a marked change in the chemical character of the photoresist. With a single quantum of light, which liberates one catalyst molecule, therefore, it is possible to initiate a multiplicity of chemical reactions, and thus to bring about a marked differentiation between the exposed and unexposed areas of the photoresist. The catalyst used is generally a strong acid, which is liberated by a photoacid generator—an onium compound, for example. The polymer contains acid-labile groups, such as tert-butyl groups, which are eliminated under the action of the strong acid liberated. The elimination of the acid-labile groups is accompanied in turn by the liberation of a group, usually acidic, such as a carboxyl group or an acid phenolic hydroxyl group. This produces a distinct change in the polarity of the polymer. The polymer originally used in the photoresist carries acid-labile groups and is soluble in apolar solvents and solvent mixtures of low polarity, such as alkanes, alcohols, ketones or esters, while the polymer following elimination of the acid-labile groups is soluble in polar solvents, generally water or basic, aqueous-organic developer solutions.

In the production of resist structures, a number of processes have already been developed, which can be divided into two families.

In the case of positive photoresists, the exposed areas of the photoresist are detached in the developing step and form trenches in the structured photoresist. In contrast, the unexposed areas remain on the substrate and form the lines of the photoresist structure.

For producing positively structured resists, the procedure described above can be adopted. AS a result of exposure, a chemical reaction is initiated in the photoresist and, as a result of this reaction, the photoresist polymer becomes soluble in alkaline developer solutions, such as a 2.38% strength solution of tetramethylammonium hydroxide in water. At the developing stage, then, a corresponding positively structured resist is obtained by removal of the exposed areas.

In the case of negative resists, in contrast to the positive-working resists, the exposed portion of the resist remains on the substrate while the unexposed portion is removed by the developer solution. When working with chemically amplified negative resists, exposure likewise first liberates catalyst, usually a strong acid. The catalyst brings about a crosslinking reaction in the photoresist, which lowers the solubility of the polymer in the developer medium. As a result of the crosslinking, the exposed area becomes insoluble while the unexposed area can be removed in appropriate developers. Developers used are usually aqueous solutions, so that the polymer in the unexposed state normally contains polar groups.

In order to be able to transfer the structure produced using the photoresist into a substrate by dry etching, the structured resist must have an etch resistance which is sufficient for the etching of a substrate. This is especially problematic in the case of resists with the 157 nm and the 13 nm technology, since at these wavelengths the existing photoresists exhibit a high absorption. It is therefore possible to use only very thin polymer films, in order to ensure that the radiation used for exposure is able to penetrate into even the deep areas of the resist in sufficient intensity, and liberates sufficient amounts of catalyst. Where inadequate amounts of catalyst are released in the deeper layers of the photoresist, elimination of the acid-labile groups is incomplete or, in extreme cases, does not occur at all. A consequence of this is that, following developing, residues of the polymer remain in the trenches, forming what are known as "resist feet". Owing to its low layer thickness, the resistance of the structured photoresist to an etch plasma is inadequate, which is why it is sensible to raise the etch resistance. For this purpose, the structured resist is chemically amplified following development, by the introduction into the polymer of additional silicon-containing or aromatic groups. The incorporation of silicon-containing amplifying agents into the polymer is generally referred to as silylation and the incorporation of aromatic groups as aromatization. In the fluorine plasma, volatile silicon tetrafluoride is formed from the silicon present in the resist. Amplification of the structured resist by silicon atoms is not sensible in this case. In order to raise the resistance of the resist to a fluorine plasma, therefore, the structured resist is amplified with aromatic amplifying agents.

In order to amplify the resist structure, the amplifying agent can be applied in solution in an appropriate solvent or else from the gas phase to the structured resist. Where the resist structures have a sufficient layer thickness, it is possible to bring about not only a growth in layer thickness perpendicularly to the substrate surface but also a narrowing of the trenches by lateral growth of layers on the sidewalls of the trenches of the structured resist. By this means it is possible to allow the resolution to be improved; in other words, for example, the representation of narrower conductor tracks. It is accordingly possible to produce structures which lie below the resolution limit of the optical systems used. A process of this kind is described, for example, in EP 0 395 917 B1.

In order to transfer structures produced with very short wavelength exposing radiation into a substrate, a resist system composed of two layers has been used to date. The top layer of the resist system is comparatively thin and photostructurable. Following exposure, contrasting, and developing, the structured resist is amplified with a silicon-containing amplifying agent and the structure is transferred into the bottom layer of the resist system using an oxygen plasma. The bottom layer is composed of a resist which, although of low etch resistance to an oxygen plasma, possesses high etch resistance to a fluorine plasma. A resist of this kind comprises polymers with a high aromatic fraction, such as an etch-resistant novolac, a cresol resin. After the structure has been transferred into the bottom layer using an oxygen plasma, the plasma is changed and the structure is transferred into the substrate using a fluorine plasma. The substrate is composed, for example, of silicon, silicon nitride or silicon dioxide, so that material can be removed from the substrate by the conversion of the silicon-containing substrate into volatile silicon tetrafluoride. Because of the two-layer resist and the change of plasma system, the process is complicated and relatively expensive.

SUMMARY OF THE INVENTION

It is accordingly an object of the invention to provide a method for chemically post-exposure amplifying (consolidating) structured resists, which overcomes the above-mentioned disadvantages of the heretofore-known devices and methods of this general type and which provides for a process which is easy to carry out, produces an increase in the etch resistance of the resist in a fluorine plasma, and allows very fine structures to be produced on the surface of a wafer.

With the foregoing and other objects in view there is provided, in accordance with the invention, a method of consolidating structured resists, which comprises:

providing a substrate with a photoresist comprising at least one polymer containing anchor groups for attachment of an amplifying agent;

sectionally exposing and developing the resist to form a structured resist;

applying an amplifying agent to the structured resist, the amplifying agent containing at least one bicyclic or polycyclic non-aromatic group and at least one reactive group capable of coordinating to the anchor groups of the polymer; and removing excess amplifying agent.

In other words, the objects of the invention are achieved by a process for post-exposure amplifying structured resists wherein a photoresist comprising at least one polymer which contains anchor groups for attachment of an amplifying agent is applied to a substrate, sectionally exposed, and developed to give a structured resist and an amplifying agent is applied to the structured resist, said agent containing at least one bicyclic or polycyclic non-aromatic group and also at least one reactive group which is able to coordinate to the anchor groups of the polymer, and then excess amplifying agent is removed.

In the process of the invention, first of all a layer of a photoresist is produced in a substrate by known methods and then exposure and developing are carried out conventionally. This gives a structured resist comprising, for example, trenches and lines. Then, in contrast to the post-exposure amplifying techniques known to date, bicyclic or polycyclic groups rather than silicon-containing or aromatic groups are introduced into the polymer. In this way it is possible to achieve an increase in the etch resistance to a fluorine plasma which is comparable with that achieved by introducing aromatic groups.

With the resists amplified by the process of the invention, therefore, when the structure is transferred into the substrate there is no need to change the plasma system; instead, the structure can be transferred into the substrate directly using a fluorine plasma.

The amplifying agents used are bicyclic or polycyclic compounds which contain at least one reactive group for attachment to the anchor group of the polymer.

The parent structures of the amplifying agent that are used are bicyclic or polycyclic compounds having preferably from 7 to 20 carbon atoms. Examples of such parent structures are adamantane, norbornane, bicyclo[2.2.2]octane, and bicyclo[5.2.1.0$^{2,6}$] decane. Attached to these parent structures, where appropriate via a short spacer, are one or more reactive groups. Spacers used include short alkylene chains having from 1 to 6 carbon atoms, such as a methylene group, an ethylene group or a propylene group, for example. These spacers carry a reactive group, preferably at the ends. A suitable example is a hydroxyl group, an amino group, a sulfonic acid group, a thiol group, a carboxyl group, a glycidyl ether, an anhydride group, an imide, an isocyanate group, a urethane, a ketene or an epoxide.

For the amplifying agent it is also possible to use heterocyclic parent structures, e.g., 1,5-diazabicyclo[4.3.0]non-5-ene, 1,4-diazabicyclo[2.2.2]octane or 1,8-diazabicyclo[5.4.0]undec-7-ene. The reactivity of the tertiary amino groups present in these parent structures is low. For this reason, here again it is preferred for further reactive groups to be attached to the parent structure, where appropriate via a short spacer.

Polymers which can be used for the photoresist are those which, in the structured resist, still contain anchor groups which are able to react with the amplifying agent. The reaction may lead to the formation of a covalent bond between anchor group and amplifying agent. However, it is also possible for the amplifying agent to be attached to the anchor group of the polymer by way of noncovalent bonds, e.g., ionic interactions or dipole-dipole interactions. The polymer must have adequate film-forming properties to be able to produce a uniform film of the photoresist on the substrate. Preference is given to using polymers which, within the polymer chain or pendantly, possess acid-labile groups of low alkali solubility which, as a result of catalytic action of acid and, where appropriate, a simultaneous temperature treatment (contrasting) produce polar groups, acidic groups for example, on the polymer. Examples of suitable acid-labile groups include the following: tert-alkyl ester, tert-butoxycarbonyloxy, tetrahydrofuranyl, tetrahydropyranyl, tertbutyl ether, lactone or acetal groups. Tert-butyl ester groups are particularly preferred. The polymer preferably contains groups which bring about an increased transparency of the polymer (and hence of the resist layer) for light of very short wavelength, 157 nm for example, such as 1,1,1,3,3,3-hexafluoro-2-hydroxyisopropyl groups, for instance, where the hydroxyl function is protected by a tertbutyl ether, tert-butoxycarbonyloxy, tetrahydrofuranyl, tetrahydropyranyl, acetal or other acid-eliminable group. In addition to the polar groups protected by an acid-labile group, the polymer preferably further contains reactive anchor groups to which the amplifying agent can be attached. Reactive anchor groups are those anchor groups which are not protected by acid-labile groups and which exhibit sufficient reactivity for reaction with the amplifying agent. The attachment of the amplifying agent to the reactive anchor groups may therefore take place immediately after developing, on the structured resist, without the anchor groups having to be liberated first. Such reactive anchor groups are preferably carboxylic acid anhydride groups, which can be introduced into the polymer by copolymerizing corresponding unsaturated carboxylic anhydrides. Examples of such carboxylic acid anhydrides are maleic anhydride, itaconic anhydride, methacrylic anhydride, and norbornenedicarboxylic anhydride. Other reactive anchor groups for the attachment of the amplifying agent may also be provided in the polymer. Examples of groups of this kind are imides, epoxides, esters, amides, ketenes, amines, oxiranes, hydroxyl groups, sulfonic acids, thiol groups, urethanes or carboxyl groups.

The film-forming polymer may therefore be obtained by polymerization or copolymerization of corresponding monomers. For the introduction of carboxyl groups which are protected by acid-labile groups, examples of suitable monomers include acrylates, methacrylates, maleic monoesters and diesters, itaconic monoesters and diesters, norbornencarboxylic esters or else norbornenedicarboxylic monoesters and diesters, esterified with a corresponding acid-labile group. Appropriate building blocks of the polymer are depicted below. Y stands for an acid-labile group, such as one of the abovementioned groups, and $R^1$ stands for a non-acid-labile radical, such as an alkyl group having from 1 to 10 carbon atoms.

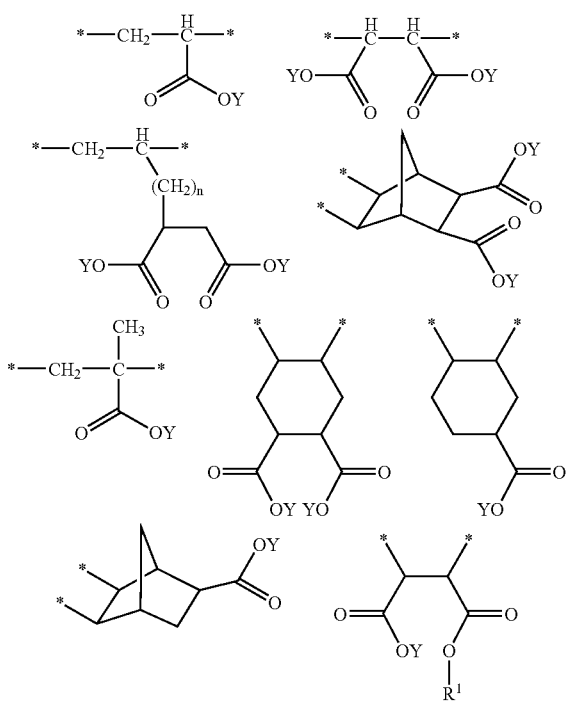

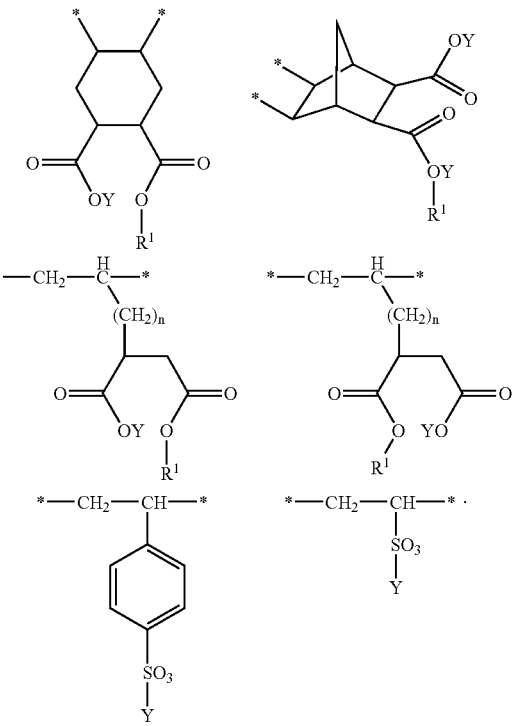

These monomers may be copolymerized with further monomers. An example of a suitable monomer is styrene. Besides the above-mentioned polymers, other monomers customary for the preparation of photoresist polymers may also be used. The photoresist polymer advantageously includes a high fraction of cyclic non-aromatic, groups, since this improves the compatibility between amplifying agent and polymer and, owing to the better miscibility and interdiffusion of the components, a more rapid amplifying reaction and a higher growth in layer thickness are achieved. Preferably, therefore, during the preparation of the polymer, cyclic non-aromatic groups are copolymerized. An example of a suitable monomer is norbornene. Examples of further suitable cyclic non-aromatic repeating units are indicated below. Y denotes an acid-labile group, such as one of the acid-labile groups mentioned above.

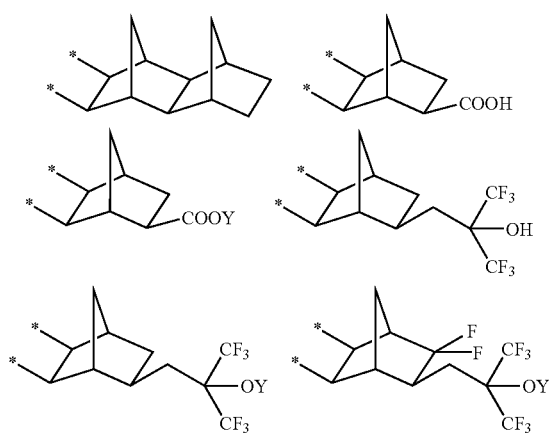

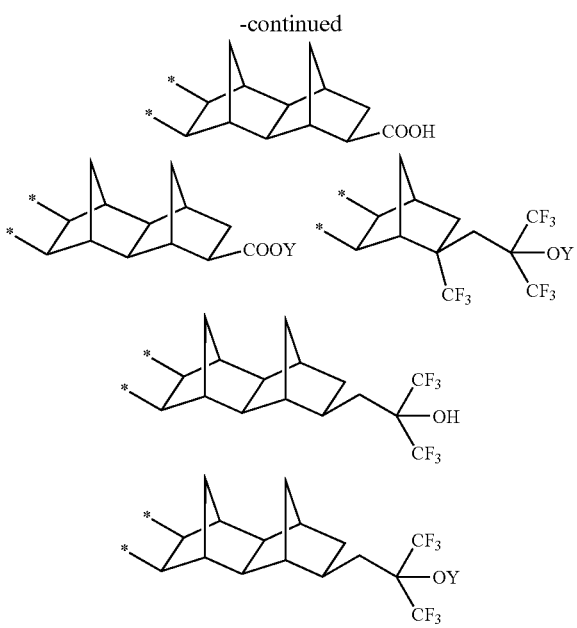

Preference is given to using resists with polymers where the polymer contains repeating units which contain carboxylic anhydride groups or bicyclic or polycyclic non-aromatic groups. Particular preference is given to copolymers of cycloolefins and maleic anhydride, which are present as the polymer in what are known as COMA resists.

The amplifying agent may be applied to the structured resist from the gas phase or else from solution. Preferably, the amplifying agent is applied as a solution. The solution may be applied, for example, by a spray, puddle or dipping process. The reaction between amplifying agent and polymer is preferably conducted at room temperature and under atmospheric pressure.

Solvents used for the amplifying agent are apolar solvents or weakly polar solvents. All common aliphatic, cyclic non-aromatic, and aromatic solvents are suitable, such as alcohols, aldehydes, ketones, lactones or esters of low polarity, and also mixtures of said solvents. Examples of suitable solvents are heptane, decane, hexanol, and isopropanol. The solvents may be used individually or in a mixture. A particularly preferred solvent is hexanol. The solvents must take up the components of the amplifying agent as an emulsion or, preferably, in a clear, homogeneous, and storage-stable solution and ought not to react with the anchor groups present on the polymer or with the amplifying agent.

Following amplification of the structured resist, excess amplifying agent is removed with an appropriate solvent and the amplified resist structure is dried.

The attachment of the amplifying agent to the polymer takes place preferably by formation of a covalent bond between the reactive anchor groups of the polymer, e.g., an acid anhydride group, and the reactive group of the amplifying agent, forming for example an amide bond.

Where a chemically amplified resist is used containing polar groups protected by acid-labile groups, however, attachment of the amplifying agent of the polymer may also take place, following elimination of the acid-labile groups, to the polar groups, which in this case form the anchor groups in the polymer. The polar group in this case is preferably a carboxyl group. Attachment of the amplifying agent to the anchor group may likewise take place with the formation of a covalent bond. Attachment is also possible, however, by way of noncovalent bonds: for example, by salt formation or by dipole-dipole interactions.

Where, for example, an amplifying agent is used that contains amino groups, and where carboxyl anchor groups are present on the polymer, the way wherein the covalent bond is formed may be that first of all, in the developing/amplifying step, an ammonium salt is formed by the anchor group and the amplifying agent and, in a later production step, e.g., during drying of the developed and amplified resist, heating is carried out, with an amide bond being formed between polymer and amplifying agent with the elimination of water.

Where the polar groups of the polymer are to be used as anchor groups, they can be liberated by subjecting the structured resist to flood exposure prior to application of the amplifying agent. This liberates acid in the structured resist, and the acid-labile groups are eliminated. In order to assist the elimination, the structured resist is preferably heated following flood exposure.

Alternatively, the chemically amplified photoresist may also comprise a thermoacid generator. In that case the structured resist is heated for the purpose of liberating the acid, and the acid-labile groups are also eliminated and the groups for the attachment of the amplifying agent are liberated.

In order to ensure a reaction rate which is sufficient for practical application in the attachment of the amplifying agent to the polymer, and a sufficient growth in layer thickness, the structured resist should be swollen by the solvent of the amplifying agent. This allows the amplifying agent to penetrate the deeper layers of the resist structure, and hence afford better amplification. Swelling of the resist can be achieved simply by an appropriate choice of solvent. If the exposed and contrasted resist exhibits only very low solubility in the solvent of the developer, or if it is insoluble in said solvent, however, it is possible to add a swelling promoter to the developer, with which the structured resist is swollen. Suitable swelling promoters include polar compounds of low molecular mass, such as water, alcohols of low molecular mass, e.g., methanol and ethanol, and aldehydes and ketones of low molecular mass, such as acetone, for instance.

The anchor group of the polymer is preferably an acidic group, such as a carboxyl group or an acidic hydroxyl group, such as a phenolic hydroxyl group, or a neutral group, such as a carboxylic acid anhydride group, which can be attached nucleophilically. The reactive group of the amplifying agent is therefore preferably a basic group. Suitable in this context in particular are amino groups, which are able to react, for example, with a carboxyl group to form an amide bond.

Particularly preferred amplifying agents are
bis(aminomethyl)adamantane, bis(aminoethyl)adamantane,
bis(aminopropyl)adamantane, norbornyldiamine,
bis(aminomethyl)norbornane, bis(aminoethyl)norbornane,
bis(aminopropyl)norbornane,
bis(aminomethyl)bicyclo[2.2.2]octane,
bis(aminoethyl)bicyclo[2.2.2]octane,
bis(aminopropyl)bicyclo[2.2.2]octane,
bis(aminomethyl)tricyclo[5.2.1.0$^{2,6}$]decane,
bis(aminoethyl)tricyclo[5.2.1.0$^{2,6}$]decane, and
bis(aminopropyl)tricyclo[5.2.1.0$^{2,6}$] decane.

The stability of the amplified structured resist can be increased further if the polymer is crosslinked. This can be achieved, for example, by virtue of the amplifying agent containing at least two reactive groups. Examples of compounds suitable for this purpose include the bicyclic or polycyclic non-aromatic compounds already mentioned above which are functionalized by two amino groups.

In the resist, the components described above are used preferably in the following proportions:

Film-forming polymer: 1–50% by weight, preferably 2-10% by weight

Photoacid generator; 0.01–10 by weight, preferably 0.1–1% by weight,

Solvent: 80–99% by weight, preferably 88–97% by weight.

In the amplifying solution the components described can be used in the following proportions:

Amplifying agent: 0.1–10% by weight, preferably 2–3% by weight

Swelling promoter: 0.01–10% by weight, preferably 0.5–2% by weight

Solvent: 80–99% by weight, preferably 92–97% by weight.

Similarly to a process described in European patent EP 0 395 917, the process of the invention can also be used for widening resist structures. Accordingly it is possible to produce structures on a wafer which lie below the resolution limit of the optical devices used to image the structure of the wafer surface. The structures in this case are widened by the lateral growth on the sidewalls of the lines. The degree of widening can be controlled very precisely by adjusting the concentration of the solution of the amplifying agent, by the reaction temperature, and by the duration of the reaction.

EXAMPLE

The invention may be better understood with reference to the following example.

A solution of a copolymer of tert-butyl methacrylate, maleic anhydride, and norbornene in methoxypropyl acetate is applied as a thin film to a silicon wafer by spin coating and the solvent is removed by heating at 130° C. on a hot plate. A photoresist layer 200 nm thick is obtained. At room temperature, the polymer layer is treated with a solution of 3% by weight norbornyl diamine and 1% by weight water in hexanol as solvent. In this case a growth in layer thickness of 40 nm is observed within 40 seconds.

The invention claimed is:

1. A method of consolidating structured resists, which comprises:
    providing a substrate with a photoresist comprising at least one polymer containing anchor groups for attachment of an amplifying agent;
    sectionally exposing and developing the resist to form a structured resist;
    applying a silicon-free amplifying agent producing an increase in the etch resistance of the resist to the structured resist,
    the amplifying agent containing at least one bicyclic or polycyclic non-aromatic group and at least one reactive group capable of coordinating to the anchor groups of the polymer; and
    removing excess amplifying agent.

2. The process according to claim 1, wherein the photoresist is a chemically amplified photoresist and the method further comprises subjecting the structured resist to flood exposure prior to the step of applying the amplifying agent.

3. The process according to claim 1, wherein the photoresist is a chemically amplified photoresist comprising a thermoacid generator and the method further comprises heating the structured resist to a temperature at which an acid is liberated from the thermoacid generator.

4. The process according to claim 1, which comprises applying the amplifying agent as a solution to the structured resist.

5. The process according to claim 4, which comprises adding to the solution of the amplifying agent a swelling promoter for swelling the structured resist.

6. The process according to claim 1, wherein the amplifying agent contains at least two reactive groups.

7. The process according to claim 1, wherein the reactive group of the amplifying agent is a basic group.

8. The process according to claim 1, wherein the amplifying agent is an amplifying agent selected from the group consisting of
    bis(aminomethyl)adamantane, bis(aminoethyl)adamantane,
    bis(aminopropyl)adamantane, norbornyldiamine,
    bis(aminomethyl)norbornane, bis(aminoethyl)norbornane,
    bis(aminopropyl)norbornane,
    bis (aminomethyl)bicyclo [2.2.2]octane,
    bis(aminoethyl)bicyclo[2.2.2]octane,
    bis(aminopropyl)bicyclo[2.2.2]octane,
    bis(aminomethyl)tricyclo[5.2.1.0$^{2,6}$] decane,
    bis(aminoethyl)tricyclo[5.2 1.0$^{2,6}$] decane, and
    bis(aminopropyl)tricyclo[5.2.1.0$^{2,6}$] decane.

9. The process according to claim 1, wherein the polymer comprises repeating units containing groups selected from the group consisting of carboxylic acid anhydride groups and bicyclic or polycyclic non-aromatic groups.

* * * * *